(12) United States Patent
Fitzpatrick et al.

(10) Patent No.: US 7,719,253 B2
(45) Date of Patent: May 18, 2010

(54) APPARATUS FOR VERIFYING A LOW NOISE BLOCK OUTPUT VOLTAGE

(75) Inventors: John James Fitzpatrick, Indianapolis, IN (US); Robert Warren Schmidt, Carmel, IN (US); Robert Alan Pitsch, Carmel, IN (US); John Joseph Curtis, III, Noblesville, IN (US)

(73) Assignee: Thomson Licensing, Boulgone-Billancourt (FR)

( * ) Notice: Subject to any disclaimer, the term of this patent is extended or adjusted under 35 U.S.C. 154(b) by 621 days.

(21) Appl. No.: 11/597,095

(22) PCT Filed: May 27, 2004

(86) PCT No.: PCT/US2004/016864

§ 371 (c)(1),
(2), (4) Date: Nov. 21, 2006

(87) PCT Pub. No.: WO2005/120073

PCT Pub. Date: Dec. 15, 2005

(65) Prior Publication Data

US 2009/0058397 A1 Mar. 5, 2009

(51) Int. Cl.
*G01R 19/165* (2006.01)
(52) U.S. Cl. .......................... 324/72; 324/713
(58) Field of Classification Search ........... 324/72, 324/710, 713; 343/713
See application file for complete search history.

(56) References Cited

U.S. PATENT DOCUMENTS 6,650,074 B1 * 11/2003 Vyssotski et al. ...... 318/400.12

6,693,597 B2 * 2/2004 Walton et al. ............... 343/713

FOREIGN PATENT DOCUMENTS

| DE | 94 11 425 U | 9/1994 |
|---|---|---|
| EP | 0 359 323 A | 3/1990 |
| EP | 1 244 308 A | 9/2002 |
| EP | 1 394 956 A | 3/2004 |
| GB | 2 384 922 A | 8/2003 |

OTHER PUBLICATIONS

Search Report of Jan. 21, 2005.
Patent Abstracts of Japan vol. 1998, No. 04, Mar. 31, 1998 & JP 09 327123A 9FUJITSU General Ltd.), Dec. 16, 1997 abstract.
Allegro Microsystems Inc: "LNB Supply and Control Voltage, Regulators" White Paper, 'Online! Jun. 30, 2003, pp. 1-14, XP002314515 Retrieved from the Internet: URL:http://www.allegromicro.com/dat. PDF> retrieved on Jan. 20, 2005! The whole document.

* cited by examiner

*Primary Examiner*—Vincent Q Nguyen
(74) *Attorney, Agent, or Firm*—Robert D. Shedd; Joseph J. Opalach; Brian J. Cromarty (57) ABSTRACT

The present invention relates to system diagnostic circuitry for antenna systems with active antenna components. More specifically, the present invention discloses an apparatus comprising a connection between an antenna and a power supply conducting a first DC voltage, a source of a pulse width modulated signal, a lowpass filter for converting the pulse width modulated signal to a second DC voltage, and a comparator for comparing the first DC voltage and the second DC voltage and generating an output signal responsive to the difference between the first DC voltage and the second DC voltage.

10 Claims, 6 Drawing Sheets

APPARATUS FOR VERIFYING A LOW NOISE BLOCK OUTPUT VOLTAGE

This application claims the benefit, under 35 U.S.C. §365 of International Application PCT/US2004/016864, filed May 27, 2004, which was published in accordance with PCT Article 21(2) on Dec. 15, 2005.

FIELD OF THE INVENTION

The present invention relates to system diagnostic circuitry for antenna systems with active antenna components.

BACKGROUND OF THE INVENTION

Satellite television receiving systems usually comprise an "outdoor unit" including a dish-like receiving antenna and a "block" converter, and an "indoor unit" including a tuner and a signal processing section. The block converter converts the entire range ("block") of relatively high frequency RF signals transmitted by a satellite to a more manageable, lower range of frequencies.

In a conventional satellite television transmission system, television information is transmitted in analog form and the RF signals transmitted by the satellite are in the C (e.g., 3.7 to 4.2 GHz) and Ku (e.g., 11.7 to 14.2 GHz) bands. The RF signal received from the satellite by the antenna of the receiving system are converted by the block converter to the L band (e.g., 900 to 2000 MHz). An RF filter section of the tuner of the indoor unit selects the one of the RF signals received from the block converter corresponding to the selected channel, and a mixer/local oscillator section of the tuner converts the selected RF signal to a lower, intermediate frequency (IF) range for filtering and demodulation.

In newer satellite television systems, such as the DirecTv™ operated by the Hughes Corporation of California, television information is transmitted in digital form. The RF signals are transmitted by the satellite in the Ku band, and are converted by the block converter to the L band. The frequency range of the RF signals transmitted by the satellite is somewhat smaller (e.g., between 12.2 and 12.7 GHz) than that for the analog satellite television system, and the frequency range of RF signals produced by the block converter is accordingly somewhat smaller (e.g., between 950 and 1450 MHz).

In a digital satellite television broadcast system, the television information is digitized, compressed and organized into a series or stream of data packets corresponding to respective video, audio, and data portions of the television information. The digital data is modulated on to a RF carrier signal in what is known as QPSK (Quaternary Phase Shift Keying) modulation and the RF signal is transmitted to a satellite in earth orbit, from which it is retransmitted back to the earth.

In QPSK modulation, the phases of two quadrature phase signals, I and Q, are controlled in response to the bits of respective digital data streams. For example, the phase is set to 0 degrees (.degree.) in response to a low logic level ("0"), and the phase is set to 180.degree. in response to a high logic level ("1"). The phase shift modulated I and Q signals are combined and the result transmitted as a QPSK modulated RF carrier signal. Accordingly, each symbol of the modulated QPSK carrier indicates one of four logic states, i.e., 00, 01, 10 and 11

The conversion stage of the block converter of the outdoor unit is powered by a DC voltage supplied by the indoor unit. The satellite television signal receivers are typically located at the subscriber's residence. When a problem with the system occurs, it is desirable for the service provider to be able to remotely diagnose the problems with the receiver, thereby possibly avoiding having to send a service technician to the remote location. If the problem is simple enough, instructions can be given to the subscriber, and the problem immediately remedied. If the problem is too complex for the subscriber to remedy, or there is an equipment failure, advanced information on the problem can be provided to the service technician, thereby allowing the technician to bring the required parts or equipment to the subscriber's location. Among the parameters desirable to be diagnosed remotely is the low noise block (LNB) line voltage. In addition to supplying operating power to the LNB, different LNB line voltages are used to select between different signals or polarizations of signals received by the LNB. There are defined ranges for each of the two allowed voltages. In order to diagnose certain kinds of problems in the receiving system, it is desirable to know with reasonable accuracy what voltage is being presented on the antenna connector at the back of the indoor unit. Having greater knowledge of the voltage allows better decision-making in determining cause and effect of problems in the receiving system. Knowing that the LNB line voltage is somewhere between or very, very close to one limit of allowable voltage is more desirable than just an indication of the voltage is higher than the allowable band for the lower voltage setting.

SUMMARY OF THE INVENTION

In order to solve the problems addressed above, the present invention concerns an LNB line voltage measurement system and method. This and other aspects of the invention will be described in detail with reference to the accompanying drawings.

DETAILED DESCRIPTION OF THE PREFERRED EMBODIMENT

The exemplifications set out herein illustrate preferred embodiments of the invention, and such exemplifications are not to be construed as limiting the scope of the invention in any manner.

Figure 1:
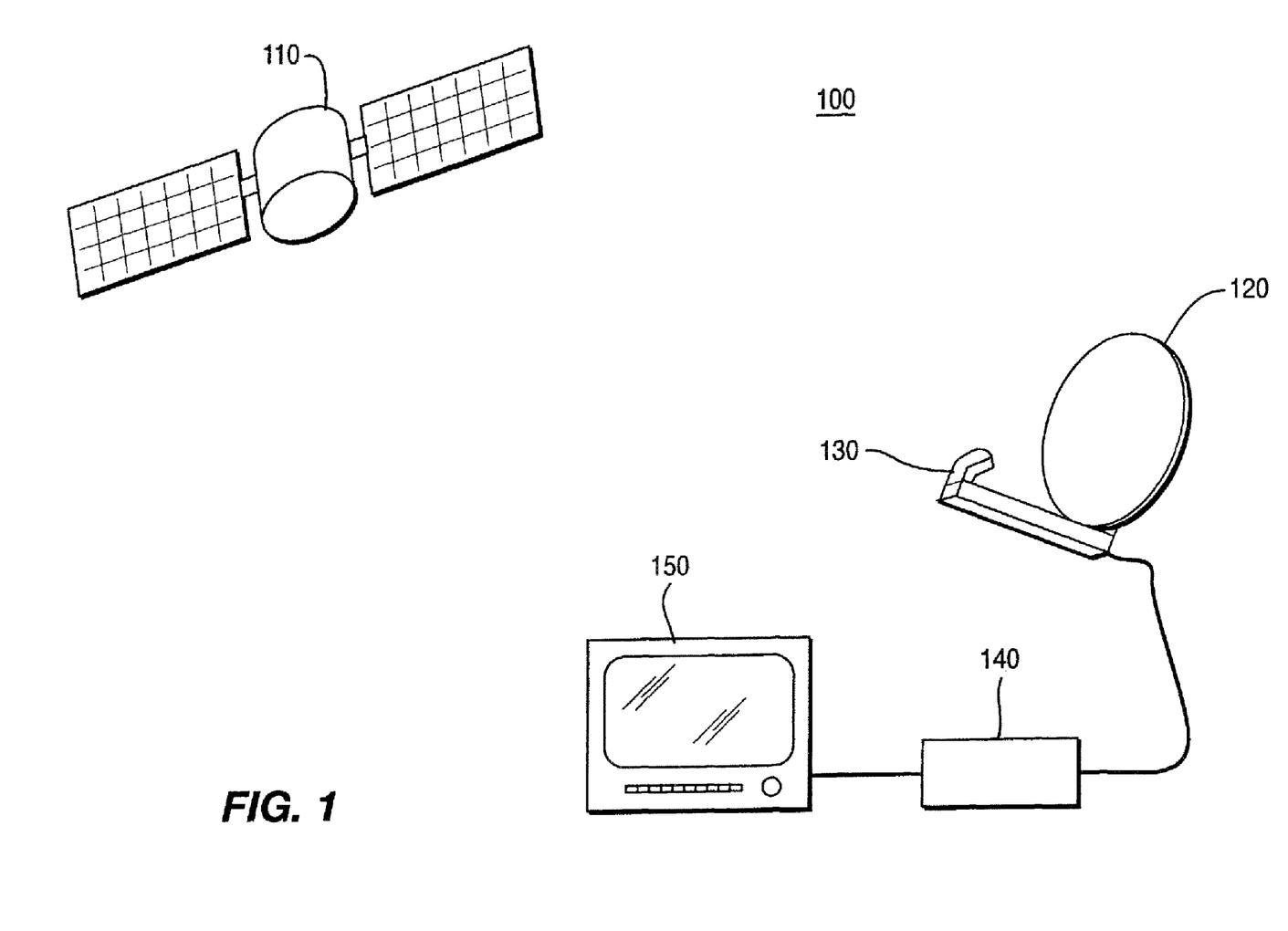
FIG. 1 is a block diagram of an exemplary embodiment of a digital satellite broadcast system.

Referring to FIG. 1, a diagram of an exemplary embodiment of a satellite television system is shown. FIG. 1 shows a transmitting satellite (110), a parabolic dish antenna (120)

with a low noise block (130), a digital satellite set-top box (140) and a television monitor (150).

A satellite broadcast system operates to broadcast microwave signals to a wide broadcast area. In a digital television broadcast system, this is accomplished by transmitting the signals from a geosynchronous satellite (110). A geosynchronous satellite (110) orbits the earth once each day and sits at approximately 35,786 kilometers above the earths surface. Since a digital television broadcast satellite (110) generally orbits around the equator it constantly remains in the same position with respect to positions on the ground. This allows a satellite receiving antenna (120) to maintain a fixed look angle.

A digital television transmitting satellite (110) receives a signal from an uplink transmitter and then rebroadcasts the signal back to earth. The altitude of the transmitting satellite (110) allows subscribers in a wide geographical area to receiving the signal. However, the distance from the earth and the severe power conservation requirements of the satellite also result in a weak signal being received by the subscriber. It is therefore critical that the signal be amplified as soon as possible after it is received by the antenna. This requirement is achieved through the placement of a low noise block (LNB) (130) at the feed horn of the parabolic dish antenna (120).

Figure 2:
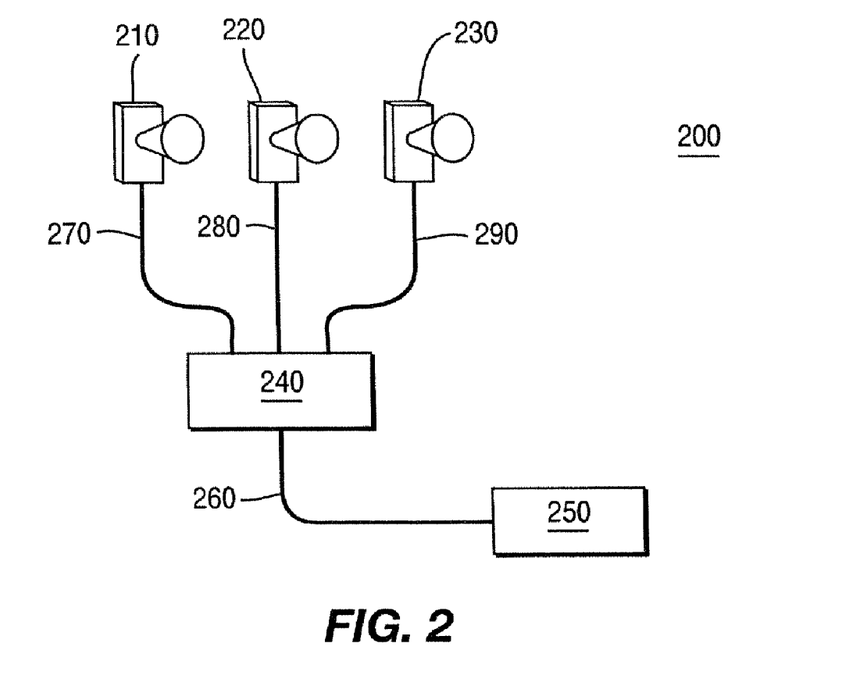
FIG. 2 is a block diagram of an exemplary embodiment of a multiple LNB configuration for use in a digital satellite broadcast system.

Referring to FIG. 2, a diagram of an exemplary embodiment of a satellite television receiver configuration is shown. FIG. 2 shows a first LNB (210), a second LNB (220), a third LNB (230), a switch (240), an indoor unit (250), a first transmission cable (270), a second transmission cable (260), a third transmission cable (280) and a fourth transmission cable (280).

The dish structure of a parabolic antenna, (120) of FIG. 1 operates in a manner to reflect an incident plane wave such that the energy from the reflected wave is focused at a point proximate to the surface of the reflector structure. This point is referred to as the focal point of the parabolic antenna. The distance between the reflector structure and the focal point is determined by the radius of the curve of the reflector surface. The reflector surface is optimally configured when all the energy focused at the focal point is in phase. This essentially occurs when the energy incident travels an identical distance from the satellite to the focal point. The position of the focal point can also change depending on the angle of the reflection compared to the incident wave. Exploiting this opportunity to move the focal point allows antenna designers to receive signals from multiple satellites by using a single reflector with multiple LNBs. Each LNB is placed at the resulting focal point for each of the satellite signals incident on the reflector.

The exemplary satellite television signal receiver shown in FIG. 2 is configured to receive signals from three different satellites by using a different LNB (210, 220, 230) at each of the three resulting focal points. Each of the LNBs (210, 220, 230) operate in the same manner, therefore only the operation of the first LNB (210) will be described.

An LNB (210) is positioned at the focal point of the reflector (120) of FIG. 1, for the satellite signal desired. A digital television signal that is transmitted by a satellite is typically in the Ku frequency range between 12.2 and 12.7 GHz. This signal from the satellite is received by a feed horn integral to the LNB (210) passed to a low noise RF amplifier where the amplitude of the signal is increased. The amplified signal is then downconverted to a relatively lower frequency RF signal between 950 and 1450 MHz. This signal is then conducted by a transmission cable (270) to a switch (240). The switch (240) has a plurality of inputs each connected by a separate transmission cable to a plurality of LNBs. As determined by the indoor unit (250) the switch routes the signal from the desired LNB through a second transmission cable (260) to the indoor unit (250). IN the exemplary embodiment shown, the switch 240 has three inputs, each connected to one of three LNBs (210, 220, 230). A digital television receiver can operate with a single LNB, in which case no switch is required, or it can operate with a large number of LNBs, each positioned with respect to the reflector surface to receive the signal from a single satellite.

To provide power to the selected LNB, the indoor unit provides a DC voltage to the second transmission cable (260), via the switch (240), via the first transmission cable (270), and finally to the selected LNB (210). The DC signal is isolated both at the Indoor unit (250) and the LNB (210) by a number of low pass and high pass filters. This DC voltage is commonly referred to as the LNB line voltage.

The satellite television signal receivers are typically located at the subscriber's residence. When a problem with the system occurs, it is desirable for the service provider to be able to remotely diagnose the problems with the receiver, thereby possibly avoiding having to send a service technician to the remote location. If the problem is simple enough, instructions can be given to the subscriber, and the problem immediately remedied. If the problem is too complex for the subscriber to remedy, or there is an equipment failure, advanced information on the problem can be provided to the service technician, thereby allowing the technician to bring the required parts or equipment to the subscriber's location. Among the parameters desirable to be diagnosed remotely is the LNB line voltage.

Figure 3:
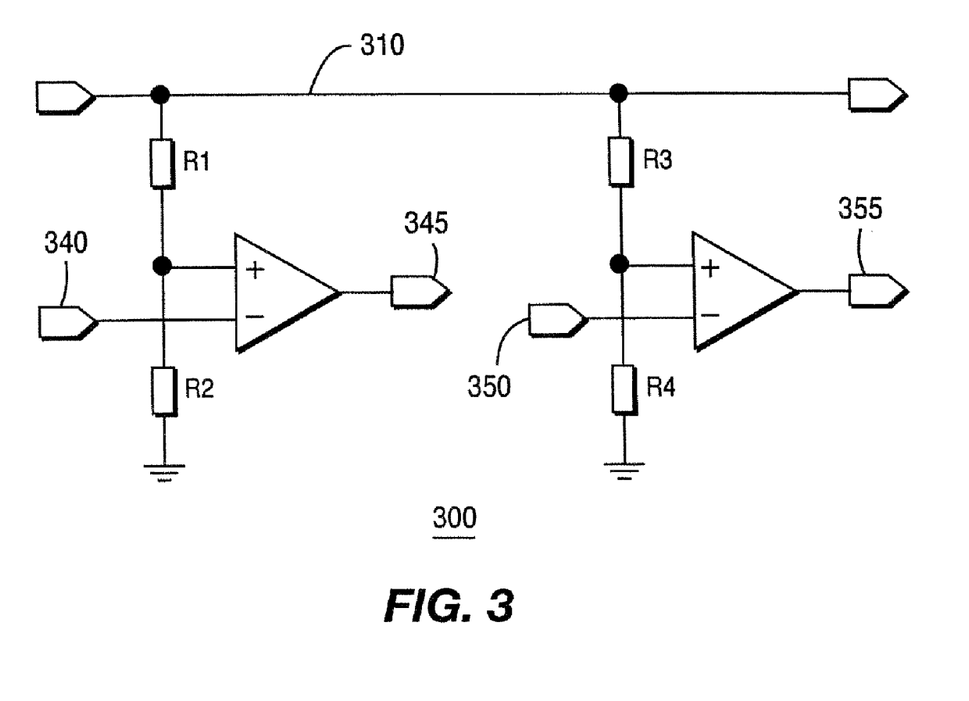
FIG. 3 is an exemplary circuit diagram of a first exemplary embodiment of an LNB line voltage measurement system.

Referring to FIG. 3, a LNB Line voltage test system is shown. The LNB line voltage system comprises a first comparator (320), a second comparator (330), an LNB voltage supply line (310), a first input (340), a second input (350), a first output (345) and a second output (355).

In this exemplary embodiment, the first input (340) of the first comparator (320) is connected to a first reference voltage. The LNB line voltage on the LNB voltage supply line (310) is divided using a conventional voltage divider network R1, R2 and compared to the first reference voltage. If the desired LNB line voltage is below the first set threshold, the first output (345) of the first comparator (320) will indicate a fault condition data bit. Similarly, the second input (350) of the second comparator (330) is connected to a second reference voltage. If the desired LNB line voltage is below the second set threshold, the second output (355) of the second comparator (330) will indicate a fault condition data bit. Two data bits are employed indicating the output voltage is below the first threshold voltage and/or below the second threshold voltage. For the exemplary embodiment, the two thresholds are set in the vicinity of 13 and 18 volts. When verification of the LNB line voltage is required, the system microprocessor of the indoor unit (250 of FIG. 2) will follow the test sequence shown in FIG. 4.

Figure 4:
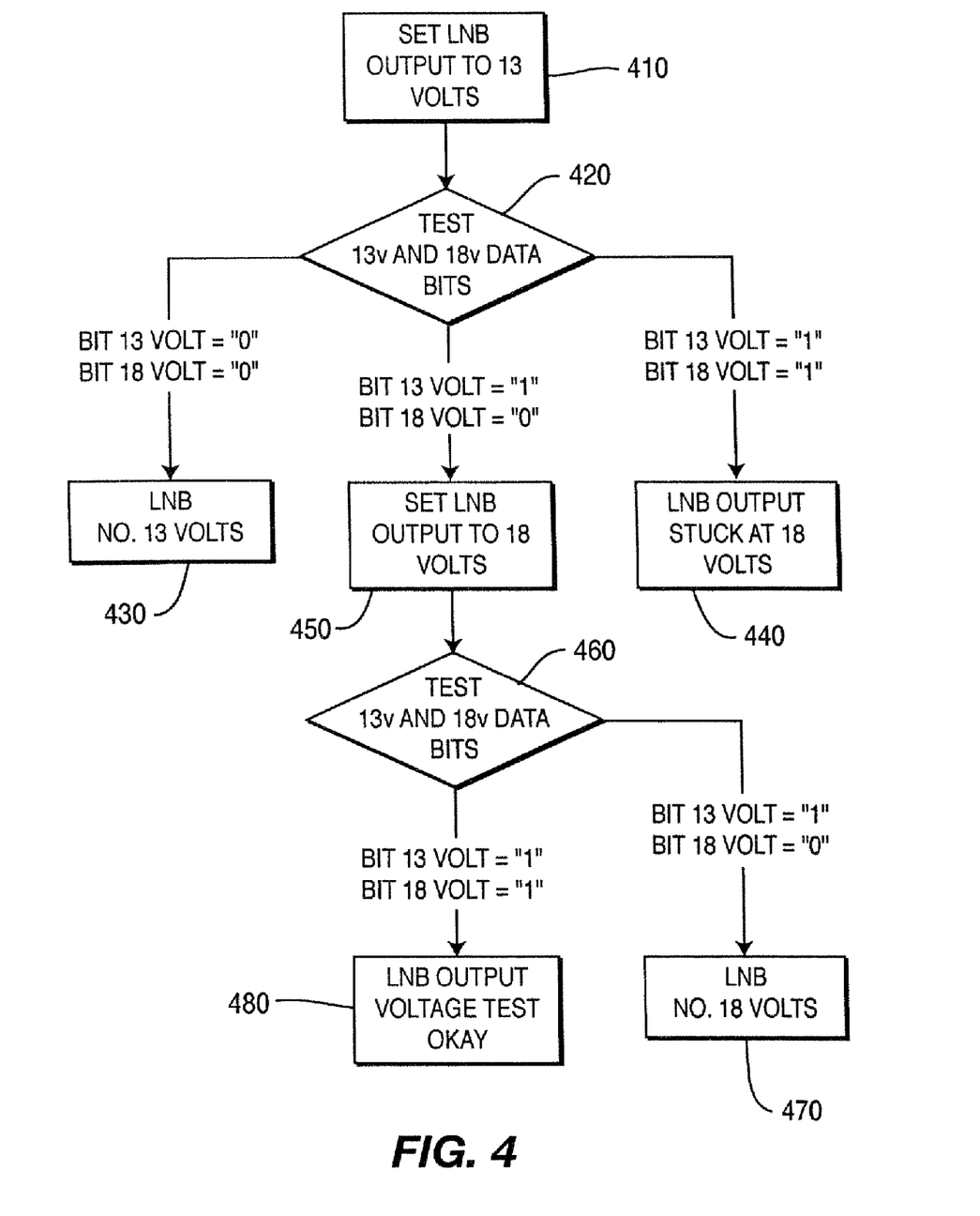
FIG. 4 is a flow chart of the system routing for measuring an LNB line voltage using the circuitry of FIG. 3.

Referring to FIG. 4 shows a test sequence followed by the system microprocessor of the indoor unit (250 of FIG. 2) when verification of the LNB line voltage is required. First the system microprocessor sets the LNB line voltage to 13 volts. (410) Then the microprocessor checks the first output (345) of the first comparator (320) and the second output (355) of the second comparator (355) to ensure that the LNB line voltage exceeds 13 volts but is less than 18 volts. (420) If the two output data bits indicate that neither the 13 volt threshold has been met or the 18 volt threshold, this indicates that no 13 volt power is being supplied to the LNB, indicating a fault condition and either the subscriber or the service provider is notified. (430) If both the 13 volt threshold and the 18 volt threshold are exceeded, this indicates that the LNB line voltage is stuck at 18 volts indicating a fault condition and either the subscriber or the service provider is notified. (440) If the 13 volt threshold is exceeded but not the 18 volt threshold, the micro sets the LNB line voltage to 18 volts. (450) The microprocessor then tests the LNB voltage to ensure that it exceeds 18 volts. (460) If the 13 volt threshold is exceeded but not the 18 volt threshold his indicates that no 13 volt power is being supplied to the LNB, indicating a fault condition and either the subscriber or the service provider is notified. (470) If both the 13 volt threshold and the 18 volt threshold are exceeded, both voltages are within desired range and the LNB voltage test is concluded. (480)

Some of the benefits of the LNB line voltage test system shown in FIG. 3 are that it requires minimal hardware and software to implement, it has reasonable accuracy over a limited range of interest, there is shared hardware over multiple LNBs.

Figure 5:
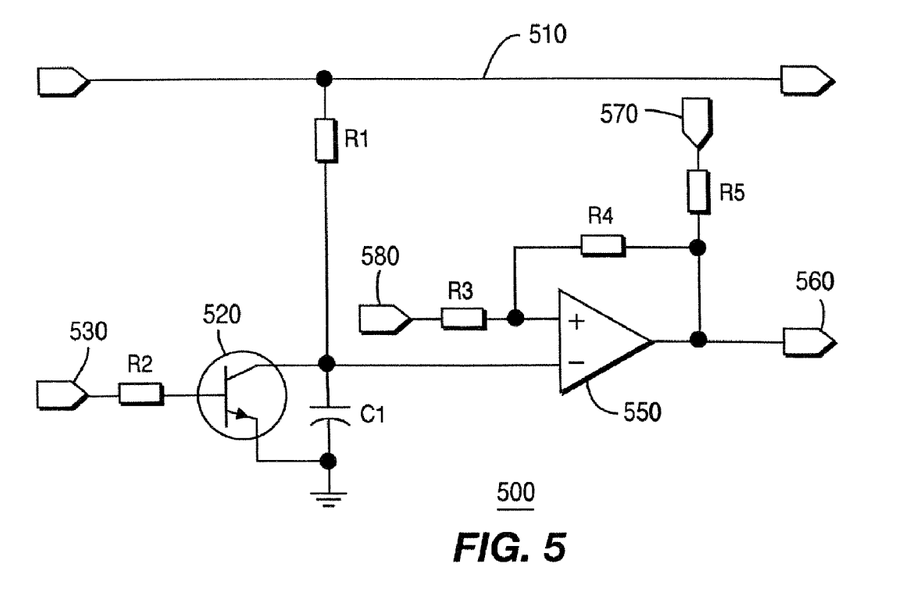
FIG. 5 is an exemplary circuit diagram of a second exemplary embodiment of an LNB line voltage measurement system.

Referring to FIG. 5, a second exemplary circuit configuration is shown for an LNB line voltage test system. The LNB line voltage test system shown in FIG. 5 comprises a timing capacitor C1, a first resistor R1, a second resistor R2, a first transistor (520), a first input (530), an LNB supply voltage line (510), a comparator (550), a third resistor R3, a fourth resistor R4, a second input (580), a third input (570) a fifth resistor R5, and an output (560). The LNB output voltage measurement circuit shown in FIG. 5, implements an Analog to Digital conversion method which translates the LNB power supply voltage (510) into a digital pulse, the width of which is measured by the system microprocessor. The microprocessor sets the first input (530) to high. This has the effect of applying a voltage to the base of the transistor (520), thereby draining any stored charge from the timing capacitor C1. Applying a voltage to the base of the transistor (520) also has the setting the collector voltage of the transistor (520) to essentially zero volts, which is the voltage seen at the inverting input of the comparator (550). Since the non inverting terminal of the comparator (550) is not higher in potential than the inverting terminal, the output (560) is set to high. To measure the LNB line voltage (510), the microprocessor sets the first input to low and captures the starts a counter. When the capacitor C1 has charged up to a level above the reference voltage (580), the output of the comparator (550) will transition from high to low. The microprocessor will stop the counter at the point when the comparator (550) transitions from high to low. This counter value is then converted to an appropriate voltage value by either computation of table lookup. The microprocessor can calculate the LNB voltage from the time measured and known component values in accordance with the standard charge formula. (Equation 1)

$$V_C = V_{LNB}(1-e^{(-t/R2C1)})$$ Equation 1

Where $V_{LNB}$ is the LNB regulator voltage being measured, t is the time to charge C1 to Vref causing the comparator (550) to transition from high to low, and Vc is the LNB output voltage.

Figure 6:
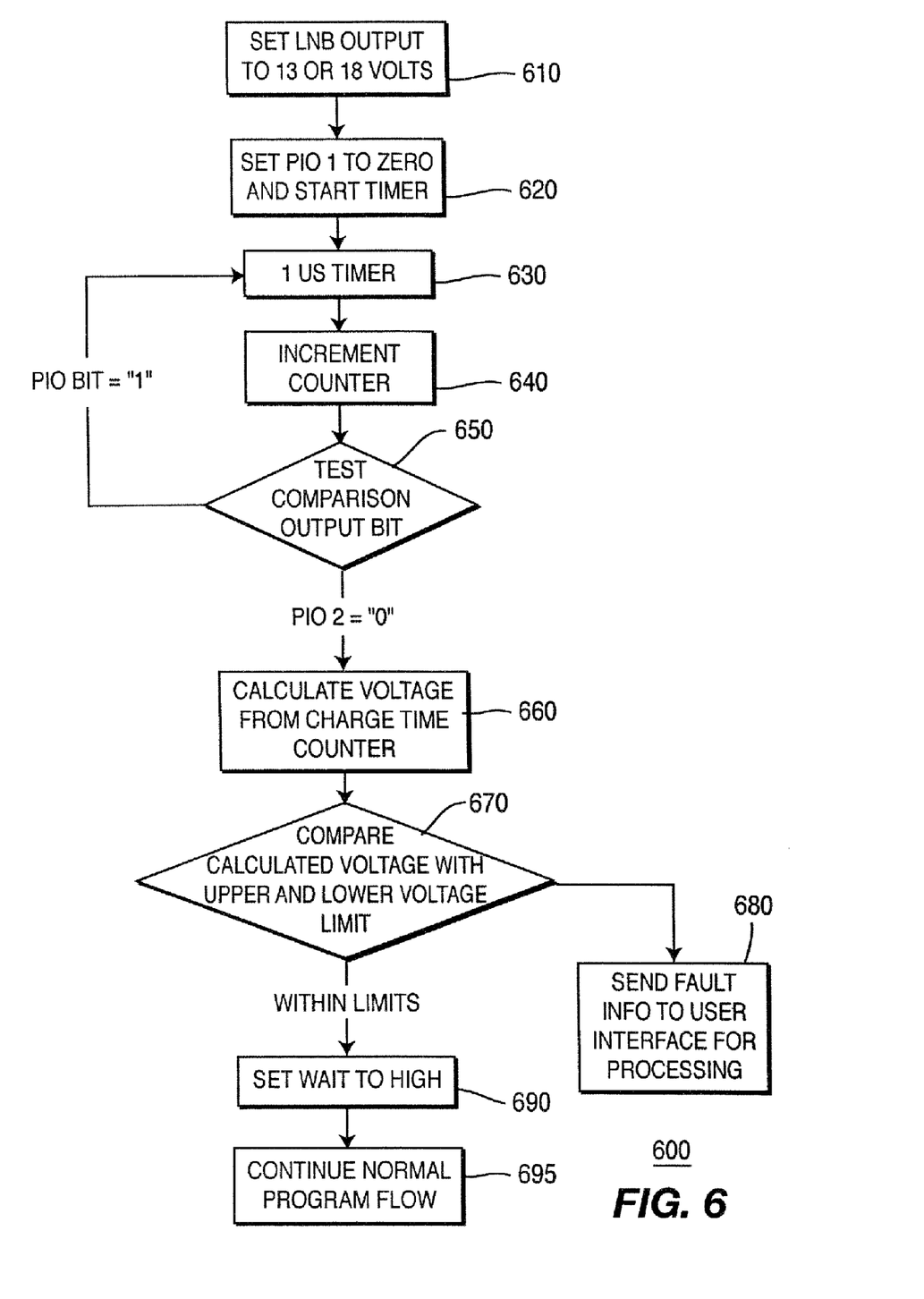
FIG. 6 is a flow chart of the system routing for measuring an LNB line voltage using the circuitry of FIG. 5.

Referring to FIG. 6 shows a test sequence followed by the system microprocessor of the indoor unit (250 of FIG. 2) when verification of the LNB line voltage is required. The microprocessor sets the LNB voltage to the desired test level, either 13 or 18 volts. (610) The microprocessor then sets the value of the first input to zero volts. (620) The microprocessor starts a counter (630), and increments that counter (640) for every cycle that the output (560) remains high (650). When the output (560) transitions to low, the microprocessor calculates the LNB line voltage using the counter value. (660) The microprocessor then compares the calculated LNB line voltage with the desired test level. (670). If the value is out of a predetermined range, indicating a fault condition and either the subscriber or the service provider is notified. 680 If the value is within the predetermined range, the microprocessor sets the level of the first input 530 to high 690 and returns to normal program flow. (695)

Figure 7:
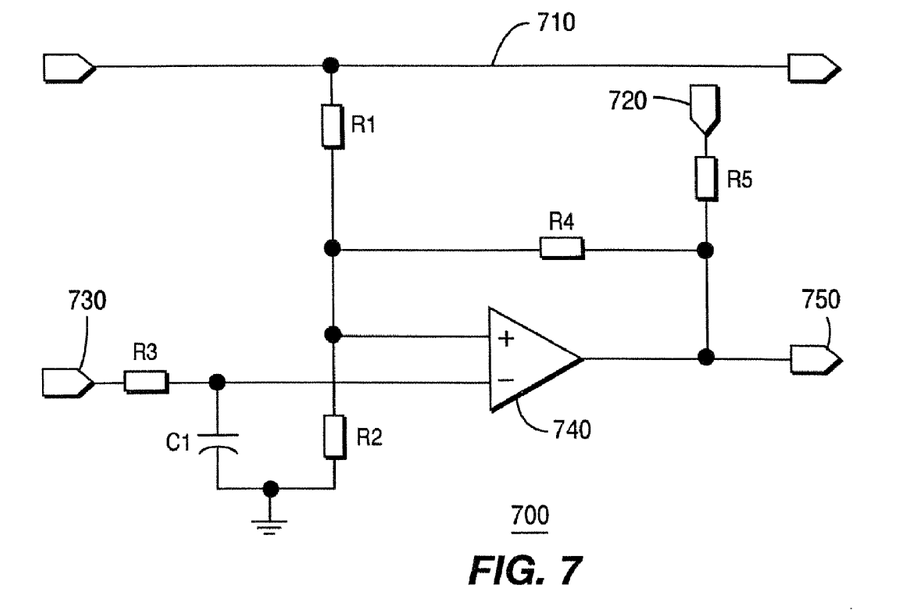
FIG. 7 is an exemplary circuit diagram of a third exemplary embodiment of an LNB line voltage measurement system.

Referring to FIG. 7, a second exemplary circuit configuration is shown for an LNB line voltage test system. The LNB line voltage test system shown in FIG. 7 comprises an LNB supply voltage line (710), a first input (730), a second input (720), a first output (750), a comparator (740), a first resistor R1, a second resistor R2, a third resistor R4, a fifth resistor R5, and a first capacitor C1. The LNB line voltage test system shown in FIG. 7 performs an analog to digital conversion of the scaled LNB line voltage (710). Typically a microprocessor would be employed to produce the pulse-width modulation (PWM) signal, such as for example, the system microprocessor of the indoor unit (250 of FIG. 2). The microprocessor applies the PWM signal to the first input (730). Changing the duty cycle of pulse width modulated signal results in a lower DC value for lower duty cycles and higher DC values for higher duty cycles. At a 100% PWM duty cycle the greatest voltage possible on the inverting input of 740 is the microprocessor Vcc value. If it is desirable in the application to have the LNB voltage scaled to a value less than Vcc for comparison as in the exemplary embodiment, the first resistor R1 and the second resistor R2 make up a voltage divider to scale the LNB voltage to a comparison value below Vcc. This pulse width modulated (PWM) signal is then passed through a low pass filter C1, R3, to convert the signal to an effective DC value. Variations in the resistor or capacitor values of the low pass filter C1, R3 affect only the removal of pulse wave modulated signal ripple, but do not reduce the overall measurement accuracy as long as the worst case ripple is smaller than one half LSB of the conversion. The comparator (740) compares the scaled LNB line voltage (710) to the DC value of the low pass filtered pulse width modulated signal. The comparator (740) applies an output data bit to the output (750). The system microprocessor of the indoor unit (250 of FIG. 2) then reads this output bit which indicates if the converted PWM DC value is higher or lower than the scaled LNB line voltage. (710) Successive approximation, ramp method, or other methods are used to discover the closest comparison point of the scaled LNB voltage (710). When the A to D conversion cycle is complete, the final percentage of pulse width modulated duty cycle is then multiplied by the pulse width modulated amplitude or system microprocessor PIO Vcc to indicate the scaled value of the measured LNB voltage (710). The actual LNB voltage (710) is this value multiplied by the scaling factor of the first resistor R1 and the second resistor R2. LNB voltage limits are read from memory accessible to the system microprocessor and the system program reports the LNB voltage status to the subscriber or the service provider.

To keep the comparator circuit from oscillating when the comparison voltage is at or near the switching point hysteresis is added to the comparator circuit. The hysteresis is achieved with the positive feedback of R4.

Figure 8:
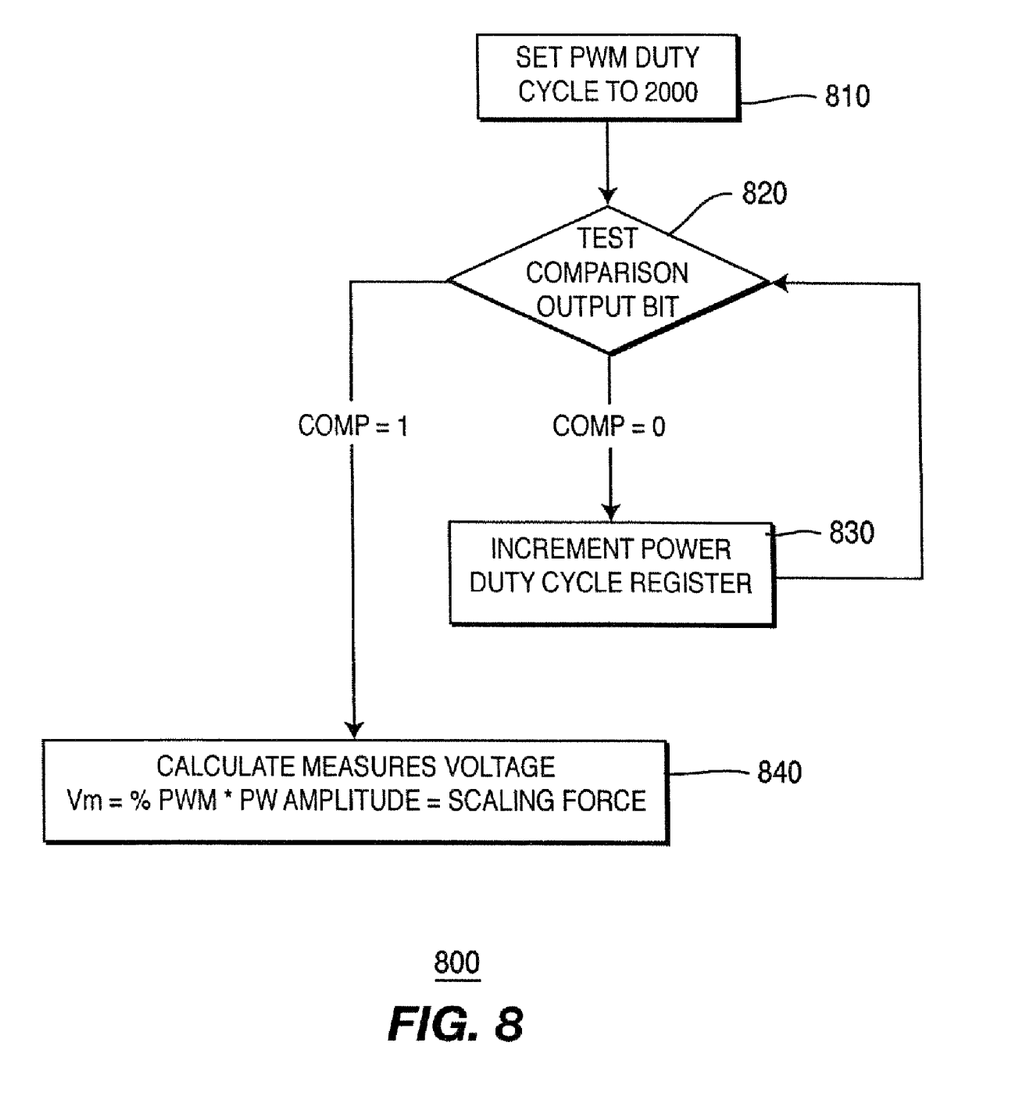
FIG. 8 is a flow chart of the system routing for measuring an LNB line voltage using the circuitry of FIG. 7.

Referring to FIG. 8 a test sequence is shown using the ramp method of approximation which is followed by the system microprocessor of the indoor unit (250 of FIG. 2) when verification of the LNB line voltage is required using the circuitry shown in FIG. 7. When required to test the LNB line voltage, the system microprocessor of the indoor unit (250 of FIG. 2) sets the pulse width modulated signal applied to the first input (730 of FIG. 7) to a 0% duty cycle. (810) The microprocessor then reads the output (750 of FIG. 7) of the comparator (740 of FIG. 7). (820). If the output is low, this indicates that the scaled LNB voltage does not exceed the effective DC value of the filtered PWM signal. If the output is low, the system microprocessor increments the PWM duty cycle by a predetermined amount 830. The system microprocessor then rereads the output (750 of FIG. 7) of the comparator (740 of FIG. 7). (820) This process is repeated until the comparator output 750 indicates a high state. At this point, the high state of the output indicates that the scaled LNB voltage does exceeds the effective DC value of the filtered PWM signal. The system microprocessor then calculates the LNB line voltage based on the value of the duty cycle used during the last increment. (840). The measured LNB line voltage can be calculated by taking the product of the duty cycle, the PWM signal amplitude and any scaling factors.

While the present invention has been described in terms of a specific embodiment, it will be appreciated that modifications may be made which will fall with in the scope of the invention.

The invention claimed is:

1. An apparatus comprising:
    a supply voltage line supplying a first DC voltage;
    a source of a pulse width modulated signal;
    a lowpass filter for convening the pulse width modulated signal to a second DC voltage;
    a comparator, connected to said supply voltage line and an output of said low pass filter, for comparing the first DC voltage and the second DC voltage and generating an output signal responsive to the difference between the first DC voltage and the second DC voltage;
    a microprocessor for generating the pulse width modulated signal and receiving the output signal; and
    a switch connected between the comparator and a plurality of supply voltage lines providing a plurality of DC voltages, wherein said switch facilitates the comparison of said plurality of DC voltages with said second DC voltage generated from said pulse width modulated signal.

2. The apparatus of claim 1 wherein said first DC voltage is a low noise block power supply voltage.

3. The apparatus of claim 1 wherein said first power supply signal is a low noise block power supply voltage.

4. An apparatus comprising:
    a supply voltage line conducting a first power supply signal;
    a source of a pulse width modulated signal;
    a lowpass filter for converting the pulse width modulated signal to a substantially DC voltage; and
    a comparator, connected to an output of said supply voltage line and an output of said lowpass filter, for comparing the first power supply signal and the substantially DC voltage and generating an output signal responsive to the difference between the first power supply signal and the substantially DC voltage;
    a microprocessor for generating the pulse width modulated signal and receiving the output signal; and
    a switch connected between the comparator and a plurality of supply voltage lines, wherein said switch facilitates the comparison of said plurality of supply voltages with said substantially DC voltage generated from said pulse width modulated signal.

5. A method of measuring a low noise block (LNB) line voltage comprising the steps of:
    applying a pulse width modulated waveform to a first input;
    processing said pulse width modulated waveform to produce an effective DC voltage;
    comparing said effective DC voltage to said LNB line voltage wherein said LNB line voltage has an amplitude;
    adjusting the characteristics of said pulse width modulated waveform until a predetermined relationship between said effective DC value and said LNB line voltage is met; and
    calculating said amplitude of said LNB line voltage using the characteristics of said pulse modulated waveform.

6. The method of claim 5 wherein the duty cycle of the pulse width modulated waveform is adjusted until a predetermined relationship between said effective DC value and said LNB line voltage is met.

7. The method of claim 5 wherein the amplitude of the pulse width modulated waveform is adjusted until a predetermined relationship between said effective DC value and said LNB line voltage is met.

8. The method of claim 5 wherein the pulse width modulated signal is processed using a lowpass filter.

9. The method of claim 5 wherein the steps of comparing said effective DC voltage to said LNB line voltage wherein said LNB line voltage has an amplitude and adjusting the characteristics of said pulse width modulated waveform until a predetermined relationship between said effective DC value and said LNB line voltage is met are performed subject to a ramp method of approximation.

10. The method of claim 5 wherein the steps of comparing said effective DC voltage to said LNB line voltage wherein said LNB line voltage has an amplitude and adjusting the characteristics of said pulse width modulated waveform until a predetermined relationship between said effective DC value and said LNB line voltage is performed by successive approximation.

\* \* \* \* \*